United States Patent
Chung et al.

(10) Patent No.: US 9,269,855 B2
(45) Date of Patent: *Feb. 23, 2016

(54) METHOD FOR MANUFACTURING HIGH EFFICIENCY LIGHT-EMITTING DIODES

(71) Applicant: Epistar Corporation, Hsinchu (TW)

(72) Inventors: Chien-Kai Chung, Hsinchu (TW); Ya Lan Yang, Hsinchu (TW); Ting-Chia Ko, Hsinchu (TW); Tsun-Kai Ko, Hsinchu (TW); Jung-Min Hwang, Hsinchu (TW); Schang-Jing Hon, Hsinchu (TW); De-Shan Kuo, Hsinchu (TW); Chien-Fu Shen, Hsinchu (TW); Ta-Cheng Hsu, Hsinchu (TW); Min-Hsun Hsieh, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/097,150

(22) Filed: Dec. 4, 2013

(65) Prior Publication Data
US 2014/0093991 A1    Apr. 3, 2014

Related U.S. Application Data

(63) Continuation of application No. 13/618,774, filed on Sep. 14, 2012, now Pat. No. 8,623,682, which is a continuation of application No. 13/191,188, filed on Jul. 26, 2011, now Pat. No. 8,486,742, which is a continuation-in-part of application No. 12/379,561, filed on Feb. 25, 2009, now Pat. No. 8,043,878, which is a continuation-in-part of application No. 11/602,199, filed on Nov. 21, 2006, now Pat. No. 7,811,845.

(51) Int. Cl.
| | |
|---|---|
| H01L 21/00 | (2006.01) |
| H01L 33/00 | (2010.01) |
| H01L 21/02 | (2006.01) |
| H01L 21/304 | (2006.01) |

(52) U.S. Cl.
CPC ........ *H01L 33/005* (2013.01); *H01L 21/02057* (2013.01); *H01L 21/3043* (2013.01); *H01L 33/0095* (2013.01)

(58) Field of Classification Search
CPC .......................... H01L 21/3043; H01L 21/784
USPC ......................................................... 438/976
See application file for complete search history.

(56) References Cited

U.S. PATENT DOCUMENTS

2005/0186760 A1*    8/2005    Hashimura et al. ........... 438/460

* cited by examiner

*Primary Examiner* — Chandra Chaudhari
(74) *Attorney, Agent, or Firm* — Ditthavong & Steiner, P.C.

(57) ABSTRACT

A method of manufacturing a light-emitting device comprising the steps of cutting a substrate by a laser beam to form a cavity in the substrate and generate a by-product directly on the substrate by the cutting, and removing the by-product by a chemical solution containing an acid under a predetermined cleaning temperature.

20 Claims, 15 Drawing Sheets

METHOD FOR MANUFACTURING HIGH EFFICIENCY LIGHT-EMITTING DIODES

REFERENCE TO RELATED APPLICATION

This application is a continuation of U.S. patent application Ser. No. 13/618,774, entitled "METHOD FOR MANUFACTURING HIGH EFFICIENCY LIGHT-EMITTING DIODES", filed on Sep. 14, 2012, now pending, which is a continuation of U.S. patent application Ser. No. 13/191,188, entitled "METHOD FOR MANUFACTURING HIGH EFFICIENCY LIGHT-EMITTING DIODES", filed on Jul. 26, 2011, now U.S. Pat. No. 8,486,742, which is a continuation-in-part of U.S. patent application Ser. No. 12/379,561, entitled "METHOD FOR MANUFACTURING HIGH EFFICIENCY LIGHT-EMITTING DIODES", filed on Feb. 25, 2009, now U.S. Pat. No. 8,043,878, which is a continuation-in-part of U.S. patent application Ser. No. 11/602,199, entitled "METHOD FOR MANUFACTURING HIGH EFFICIENCY LIGHT-EMITTING DIODES", filed on Nov. 21, 2006, now U.S. Pat. No. 7,811,845, the entire contents of which are incorporated herein by reference.

BACKGROUND

1. Technical Field

The present invention relates to methods for manufacturing light-emitting diodes and in particular to a method for producing high efficiency light-emitting diodes.

2. Description of the Related Art

Nitride semiconductor light emitting devices have been employed in a wide variety of applications, including traffic lights, backlights of electronic apparatus, outdoor optical displays, white light illumination apparatus, UV light apparatus, and data storage apparatus.

In a nitride semiconductor light-emitting device, a structure of the nitride semiconductor light-emitting device includes a substrate, which can be made of sapphire or SiC (silicon carbide). In a process of the nitride semiconductor light-emitting device manufacture, the process includes forming an epitaxial light emitting stack on a substrate wafer, and then cutting the wafer into dice. The wafer can be separated into dice by a number of ways, for example, the wafer can be mechanically scribed, such as with a diamond scribe, and then be separated along scribing lines. However, the hardness of the sapphire or the SiC is greater than traditional III-V materials (for example, Si or GaAs), and it is difficult and time-consuming to cut the wafer made of sapphire or SiC. Furthermore, the consumption of the diamond is so great that the manufacturing cost is raised.

Another separation method involves scribing the wafer by a high energy density laser beam ablating the bonds between atoms of the substrate. In laser ablation scribing, the scribing temperature has to be high enough to break the crystal bonds of the substrate and then results in the build-up of waste material along the scribing lines. Because the light emitting from the light-emitting device can be absorbed by the waste material, the light extraction efficiency is reduced.

In U.S. Pat. No. 5,631,190, a dry etching method of removing by-products generated from cutting the silicon carbide substrate by the laser light is disclosed. However, the dry etching method can damage the device and affect the product characteristics. Besides, the dry etching method causes the wafer breakage and reduces the product yield.

In U.S. Pat. No. 6,849,524, a wet etching method of using a KOH cleaning solution to remove by-products generated from cutting the sapphire substrate by the laser light is disclosed. The cleaning solution can remove slag from the cutting and debris from the breaking. This method applies a protective coating on the cutting side of the sapphire wafer, and then cleans the sapphire wafer with the cleaning solution. However, the method cannot remove the slag completely and efficiently.

Therefore, how to remove the by-products resulting from the laser beam cutting efficiently to enhance the light extraction of LEDs becomes an important issue in the industry.

SUMMARY

A method of manufacturing a light-emitting device comprising the steps of cutting a substrate by a laser beam to form a cavity in the substrate and generate a by-product directly on the substrate by the cutting, and removing the by-product by a chemical solution containing an acid under a predetermined cleaning temperature.

BRIEF DESCRIPTION OF THE DRAWINGS

The accompanying drawings are included to provide easy understanding of the invention, and are incorporated herein and constitute a part of this specification. The drawings illustrate embodiments of the invention and, together with the description, serve to illustrate the principles of the invention.

DESCRIPTION OF THE PREFERRED EMBODIMENTS

Reference will now be made in detail to the preferred embodiments of the present invention, examples of which are illustrated in the accompanying drawings. Wherever possible, the same reference numbers are used in the drawings and the description to refer to the same or like parts.

Figure 1A:
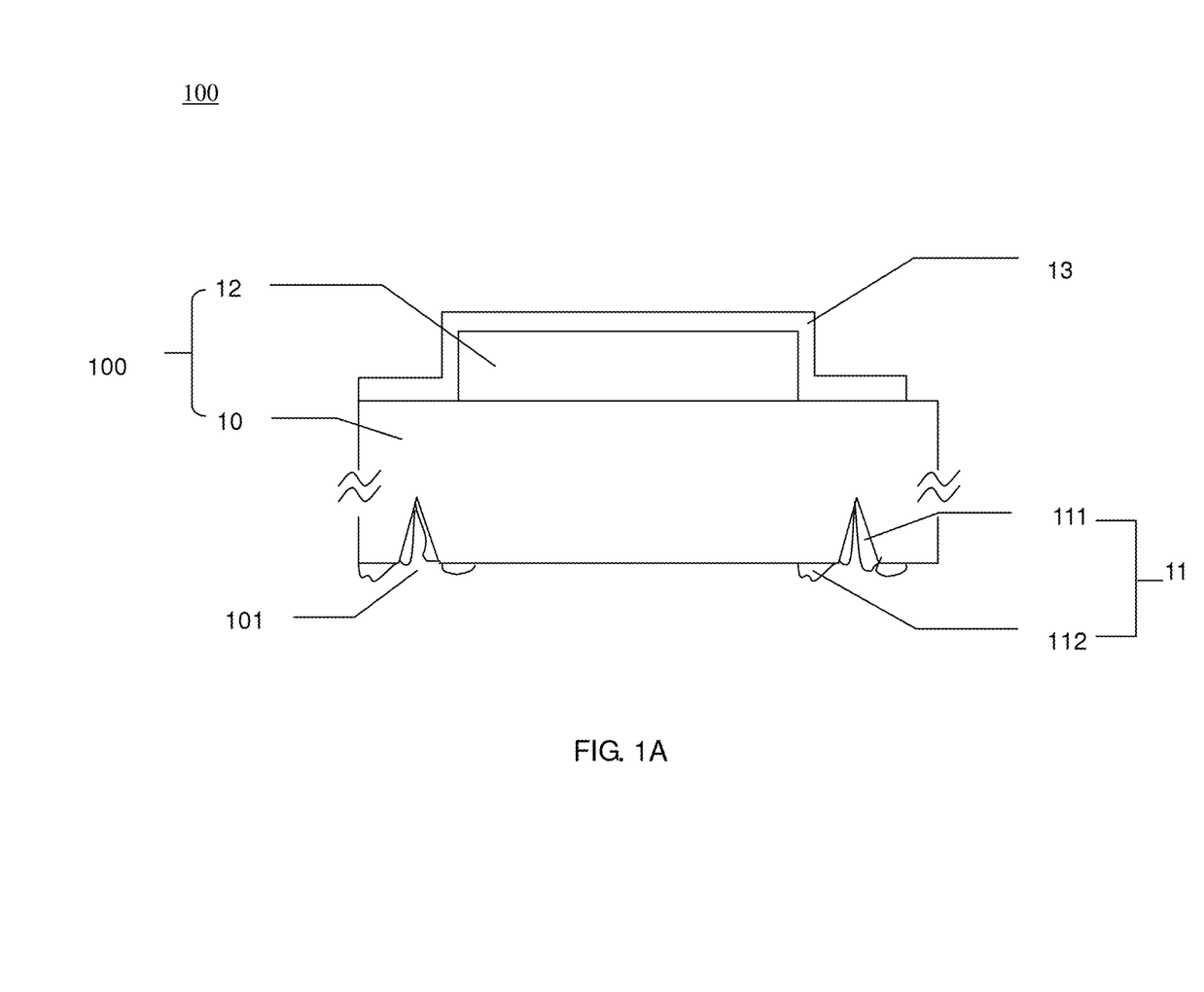
FIG. 1A is a schematic cross-sectional view of a light-emitting device with by-products deposited in accordance with a first embodiment of the present invention.
Figure 1B:
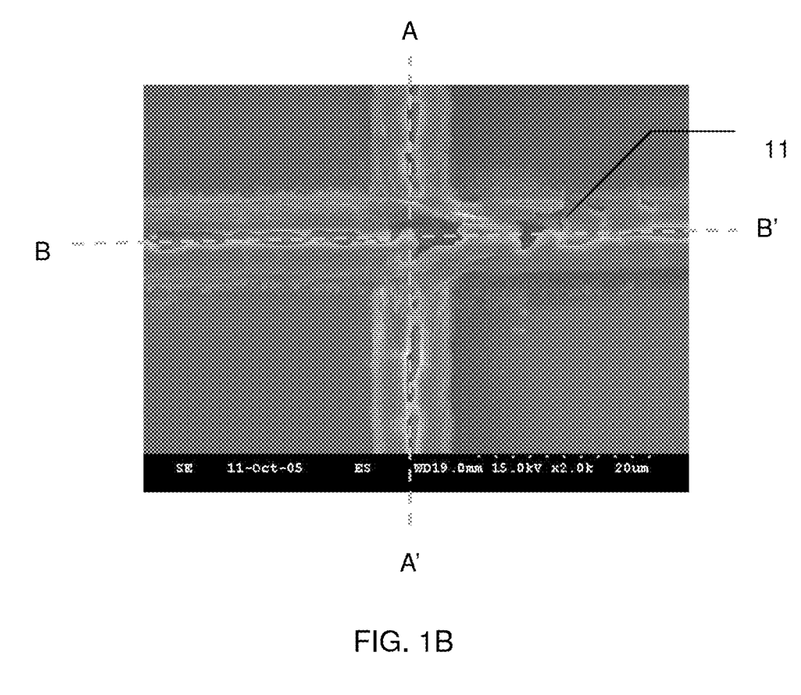
FIG. 1B is an SEM photograph showing a top-view of the light-emitting device with the by-products.
Figure 1C:
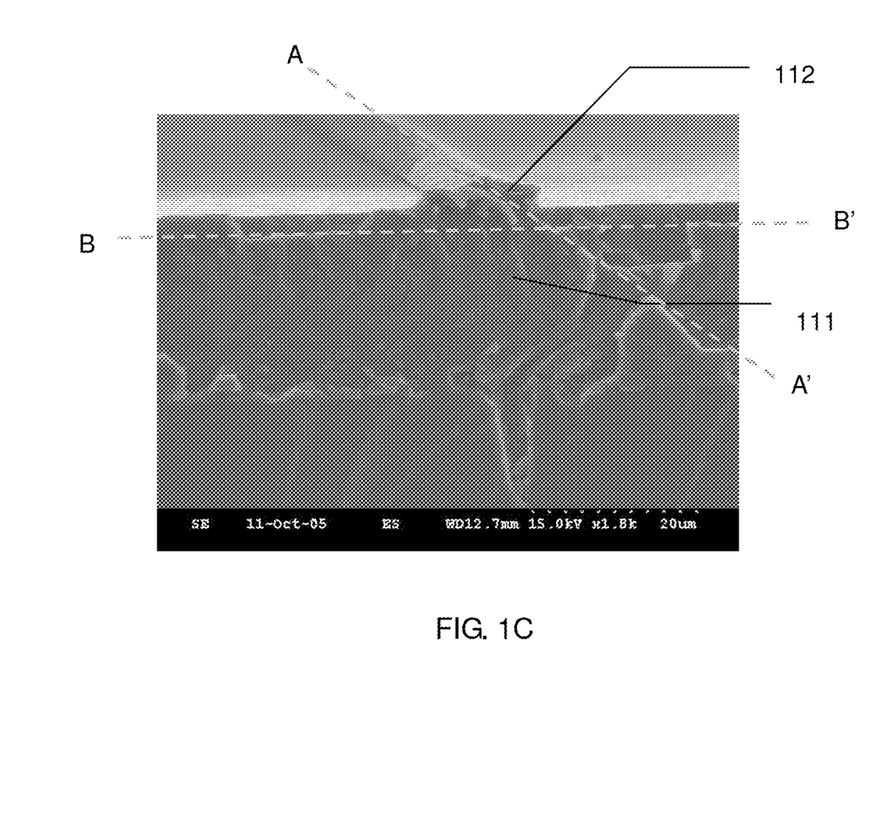
FIG. 1C is an SEM photograph showing a cross-sectional view of the light-emitting device with the by-products.

Referring to FIGS. 1A-1C, the schematic cross-sectional views showing a light-emitting device with by-products deposited in accordance with a first embodiment of the present invention respectively. The processes of manufacturing the light-emitting device comprises disposing a light-emitting stack 12 over an upper surface of a substrate 10 to form a light-emitting unit 100, coating a first protective layer 13 on an upper surface of the light-emitting stack 12. In another embodiment, the light-emitting stack 12 is trapezoid wherein the upper surface is smaller than the lower surface so the first protective layer 13 is easier to be coated on the light-emitting stack 12. The lower surface of the substrate 10 is cutting by a laser beam of a wavelength less than 365 nm to generate cutting lines 101, and then putting the light-emitting unit 100 with the first protective layer 13 into a warm chemical solution, e.g. an acid solution, for a predetermined period of time. By-products 11 comprise a first by-product 111 and a second by-product 112. The first by-product 111 is deposited in the cutting lines 101 and the second by-product 112 is deposited around the cutting lines 101 of the lower surface of the substrate 10 wherein the first by-product 111 and the second by-product 112 contain the debris of laser ablation from the light-emitting stack 12 and the substrate 10 such as sapphire.

FIG. 1B is an SEM (scanning electron microscope) photograph showing a top-view of the light-emitting device with by-products. One of the cutting lines 101 has an extension direction A-A' and the other has an extension direction B-B'. There are a lot of by-products 11 deposited around the cutting lines 101. FIG. 1C is an SEM photograph showing a cross-sectional view of the light-emitting device with by-products taken by. There are a lot of by-products 11 deposited around the cutting line along with direction A-A' and in the cutting line along with direction B-B'.

The compositions of the chemical solution are phosphoric acid ($H_3PO_4$) and sulfuric acid ($H_2SO_4$). The preferred cleaning temperature of the chemical solution is higher than the atmospheric temperature. In a preferred embodiment, the temperature of the chemical solution is 175~300° C. Furthermore, a second protective layer can be deposited on the lower surface of the substrate 10 in order to avoid any damage caused by the chemical solution.

Figure 2A:
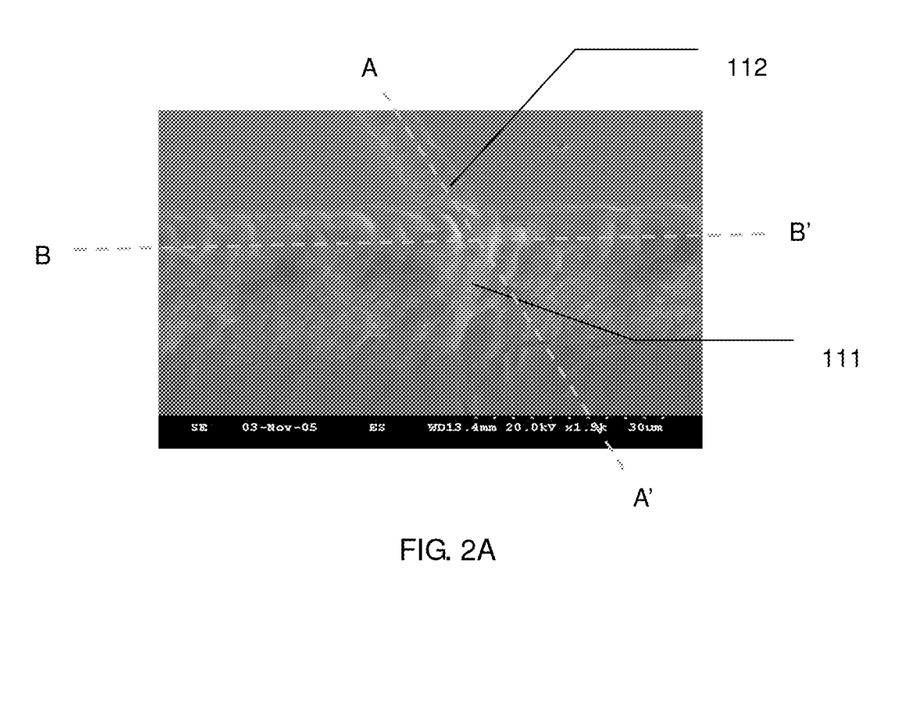
FIGS. 2A, 2B, and 2C are SEM photographs of the light-emitting device with the by-products.
Figure 2B:
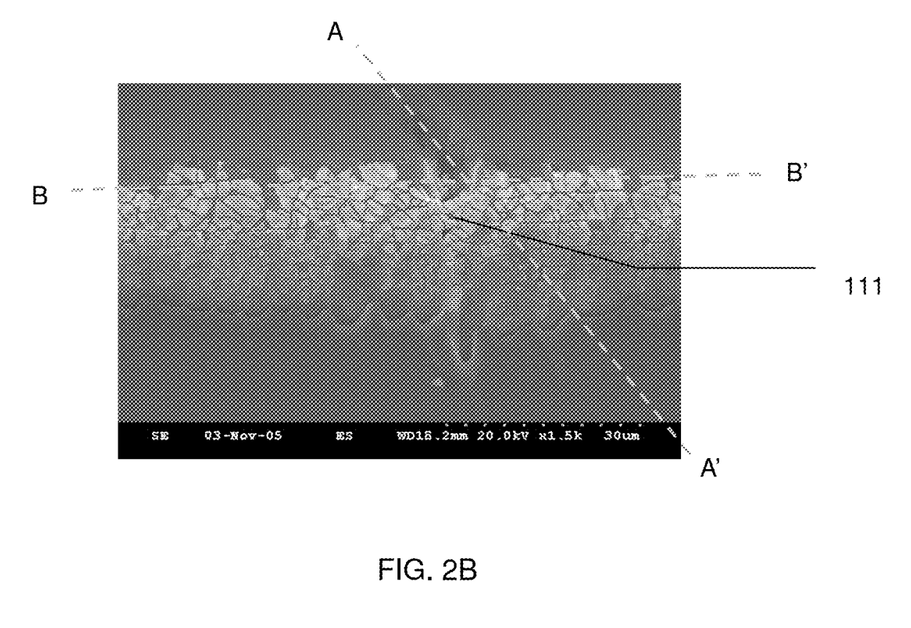
Figure 2C:
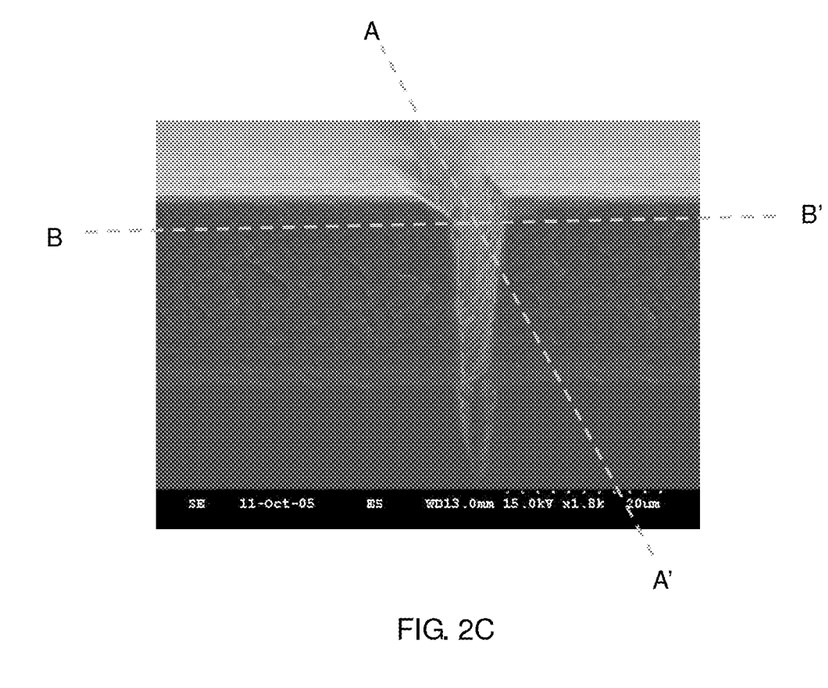

FIGS. 2A to 2C are SEM photographs showing the results of several experiments with different cleaning temperature and cleaning time. Referring to FIG. 2A, the cutting lines are cleaned by a chemical solution in an experiment I. The ratio of the $H_3PO_4$ to the $H_2SO_4$ adopted in experiment I is 2:1, and the temperature of the chemical solution is 130° C. The light-emitting device 1 is cleaned in the chemical solution for 10 minutes, but the first by-product 111 and the second by-product and 112 cannot be removed. Referring to FIG. 2B, the cutting lines are cleaned by a chemical solution in an experiment II. The light-emitting device 1 is cleaned in the chemical solution having the temperature of 240° C. for 2 minutes. The second by-product 112 deposited around the cutting line of the lower surface of the substrate 10 are removed, but the first by-product 111 deposited in the cutting line still cannot be removed. Referring to FIG. 2C, the cutting lines are cleaned by a chemical solution in an experiment III. The light-emitting device 1 is cleaned in the chemical solution of the temperature of 330° C. for 1 minute, and the first and second by-products 111 and 112 are totally removed.

Figure 3:
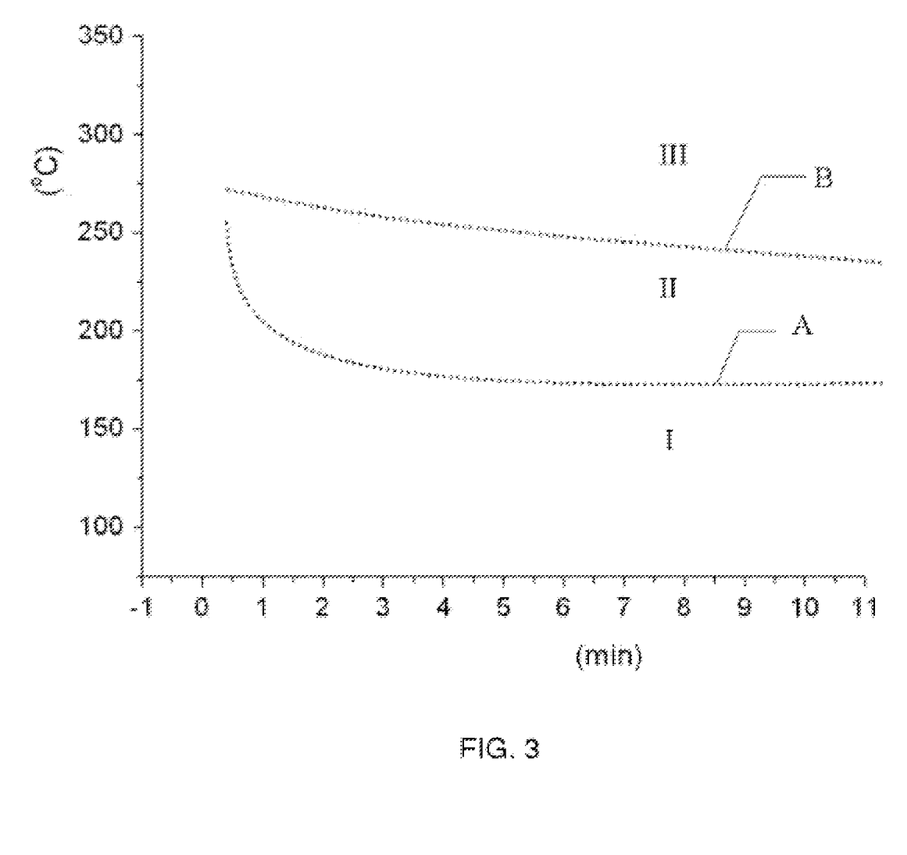
FIG. 3 is a diagram showing a relationship between by-products cleaning efficiency, cleaning temperature, and cleaning time.

The foregoing are just some experiments of the first embodiment. After many experiments, the results are plotted in FIG. 3. The curve A is a limit of the cleaning condition to remove the second by-product 112, and the curve B is a limit of the cleaning condition to remove the first by-product 111 and the second by-product 112. If a cleaning procedure is performed with the condition of region I, the by-products cannot be removed. When a cleaning procedure is performed with the condition of region II for which the temperature of the chemical solution is between 175° C. to 275° C. or 200° C. to 250° C., the second by-product 112 can be removed. When a cleaning procedure is performed with the condition of region III for which the temperature of the chemical solution is equal or greater than 275° C. or 250° C., the first by-product 111 and the second by-product 112 can be removed. It is clear from FIG. 3 that a similar removal result can be achieved by lowering the cleaning temperature but prolonging the cleaning time, or elevating the cleaning temperature but reducing the cleaning time.

The composition ratio of the chemical solution can be changed based on the user requirement. If the user prefers a shorter cleaning time, a chemical solution with a higher ratio of the $H_2SO_4$ and higher cleaning temperature can serve the purpose. The chemical solution has a good selectivity between the by-products 11 and the substrate 10, and most of the by-products 11 can be removed without damaging the substrate.

Figure 4A:
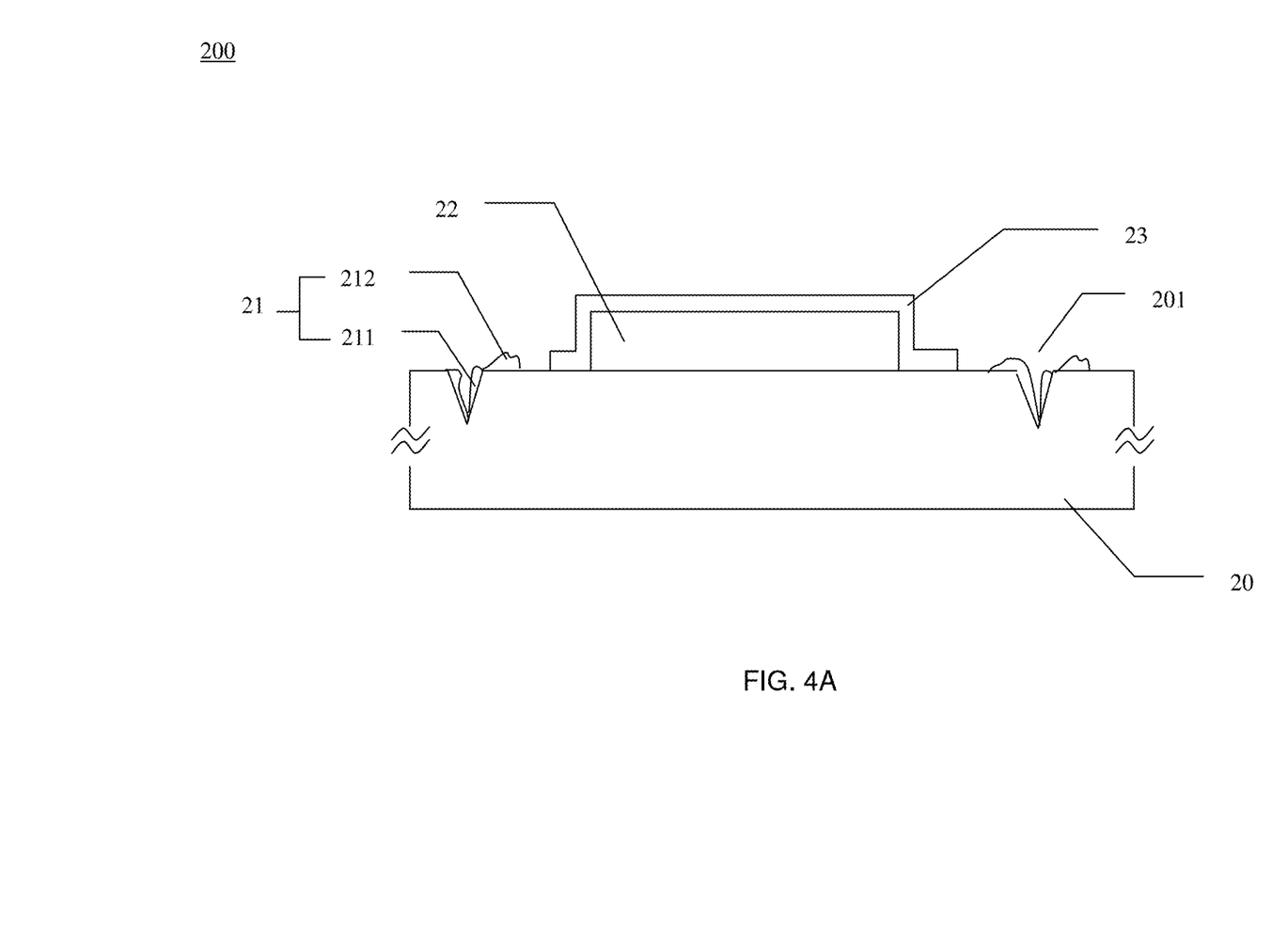
FIGS. 4A and 4B are schematic cross-sectional views of a light-emitting device with by-products deposited in accordance with a second embodiment of the present invention.
Figure 4B:
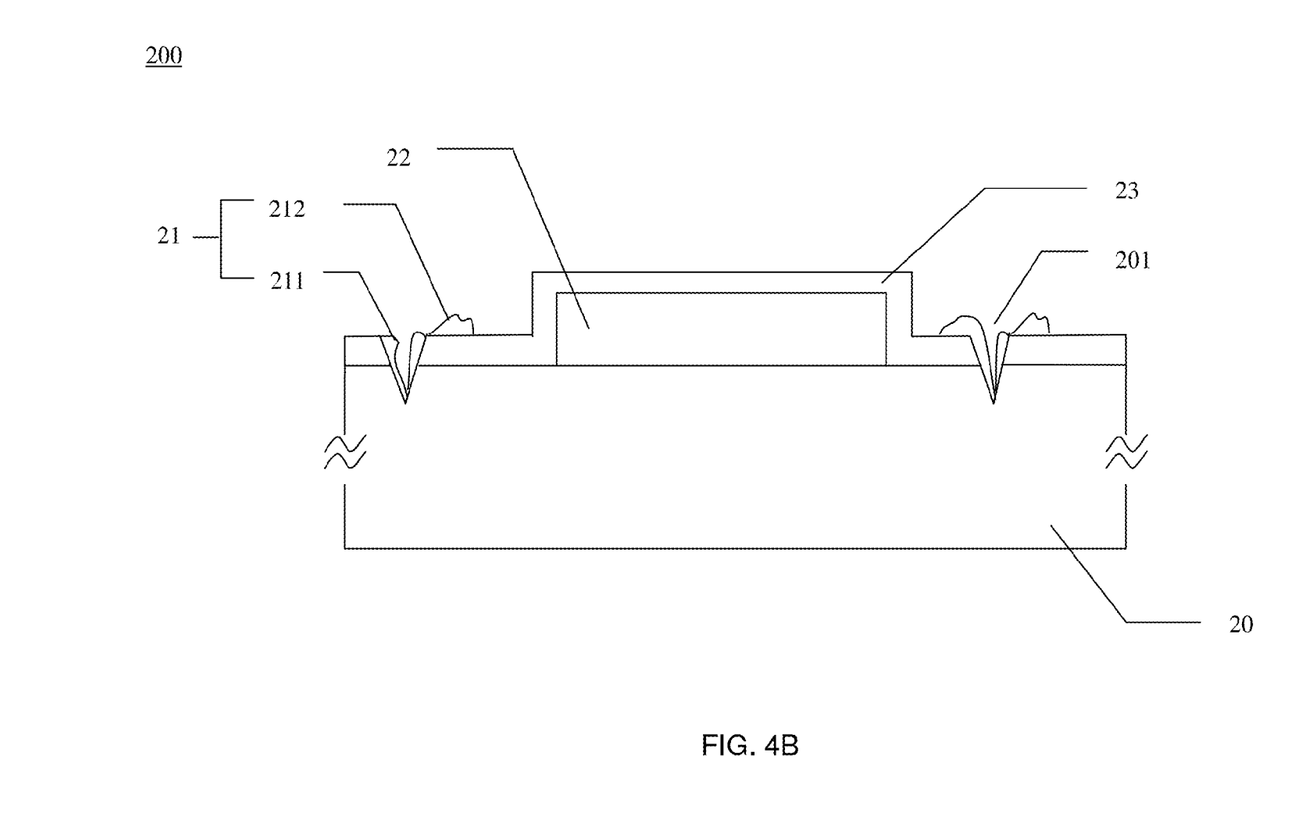

Referring to FIGS. 4A and 4B, schematic cross-sectional views of a light-emitting device with by-products in accordance with a second embodiment of the present invention is shown. The method of manufacturing the light-emitting device comprises disposing a light-emitting stack 22 over an upper surface of a substrate 20 to form a light-emitting unit 200, coating a first protective layer 23 of an exemplary thickness of 1-4 μm on an upper surface of the light-emitting stack 22. Referring to FIG. 4B, in some embodiments, the first protective layer 23 is also covering the substrate 20. In another embodiment, the light-emitting stack 22 is trapezoid wherein the upper surface is smaller than the lower surface so the first protective layer 23 is easier to be coated on the light-emitting stack 22.

Next, cutting the light-emitting stack 22 from the upper surface by a laser beam with a wavelength less than 365 nm, and putting the light-emitting unit 200 with the first protective layer 23 into a chemical solution for a predetermined period of time to remove the by-products resulted from the laser cutting. When the substrate is cut by the laser beam from the upper surface of the substrate 20, cutting lines 201 are formed. By-products 21 comprise a third by-product 211 and a fourth by-product 212. The third by-product 211 is deposited in the cutting lines 201 and the fourth by-product 212 is deposited around the cutting lines 201 wherein the third and the fourth by-products contain the debris of laser ablation from the light-emitting stack 22 and the substrate 20.

The composition of the chemical solution includes $H_3PO_4$ and $H_2SO_4$. The preferred temperature of the chemical solution is higher than the atmospheric temperature. In a preferred embodiment, the temperature of the chemical solution is 175~300° C. In another embodiment, the temperature of the chemical solution is 320° C. The light-emitting device 2 is cleaned in the chemical solution for 10-60 seconds. A second protective layer can be deposited on the lower surface of the substrate 20 in order to avoid any damage caused by the chemical solution. The depth of the cutting lines 201 can reach downward to about 5%~70% of the thickness of the substrate 20. For a substrate 20 such as sapphire at a thickness of 100~200 μm, the depth of the cutting lines 201 is substantially in a range of 5 μm to 140 μm.

Figure 5A:
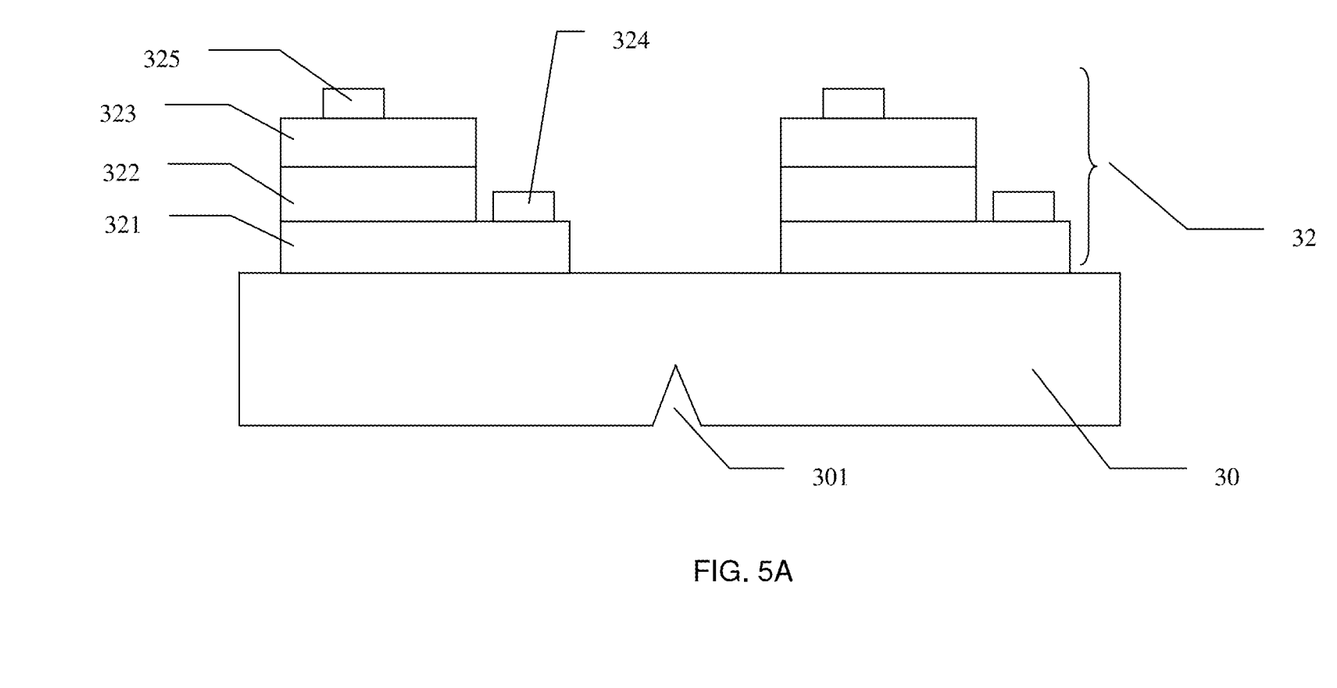
FIGS. 5A and 5B are schematic cross-sectional views of light emitting device followed by chip processing in accordance with the first and second embodiments of the present invention.
Figure 5B:
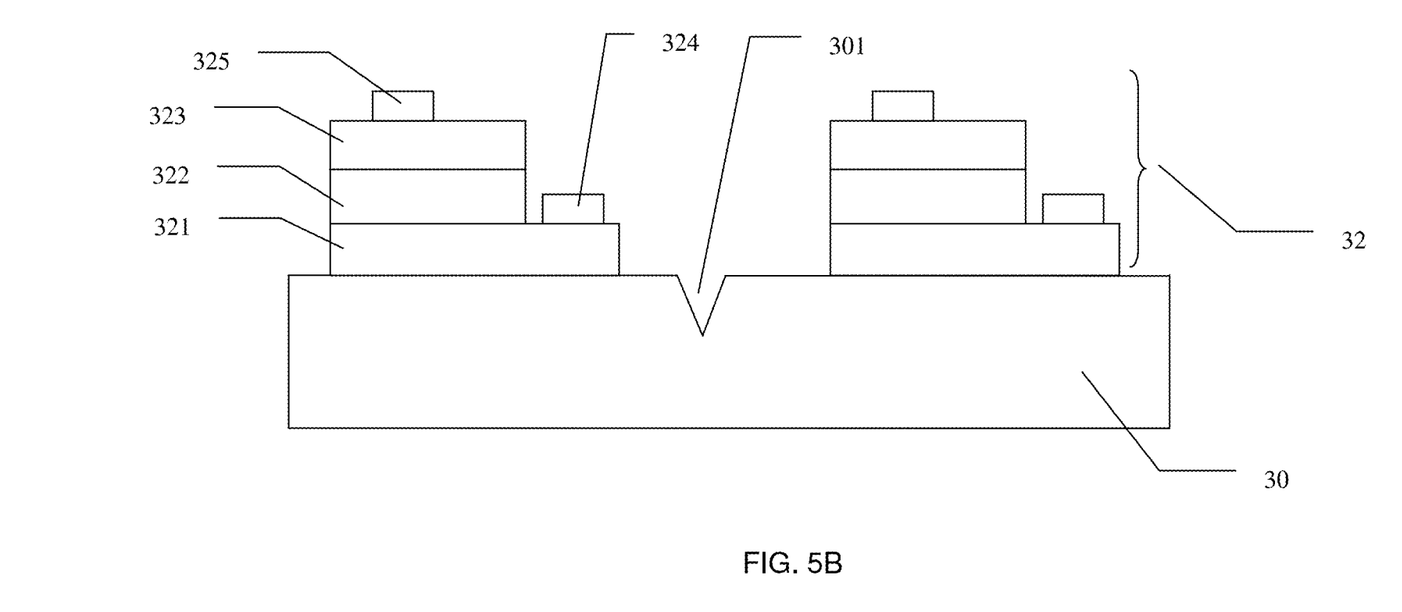

Referring to FIGS. 5A and 5B, after removing the by-products, the protective layers are removed. The light emitting stack 32 includes a first semiconductor layer 321, a semiconductor light-emitting layer 322, and a second semiconductor layer 323. The semiconductor layers 321, 322, and 323 of the light emitting stack 32 can be grown by epitaxy technology such as a metal organic chemical vapor deposition method (MOCVD method), a molecular beam epitaxy method (MBE method) or the like, and with proper doping if necessary. The semiconductor light-emitting layer 322 and the second semiconductor layer 323 are etched to expose partial of the first semiconductor layer 321. Following, a first electrode 324 and a second electrode 325 are formed on the first semiconductor layer 321 and the second semiconductor layer 323 respectively.

Figure 6A:
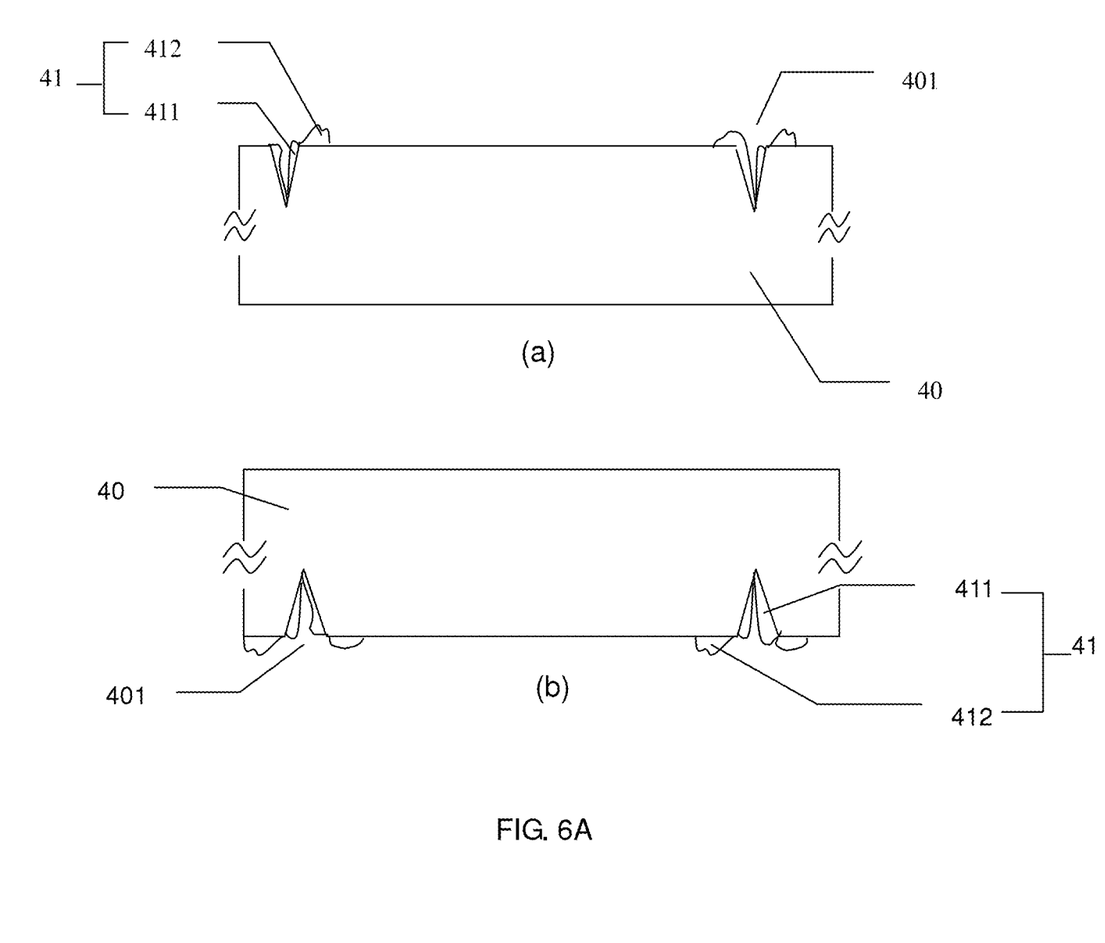
FIGS. 6A and 6B are cross-sectional views showing the formation of light emitting device in accordance with the third embodiments of the present invention.
Figure 6B:
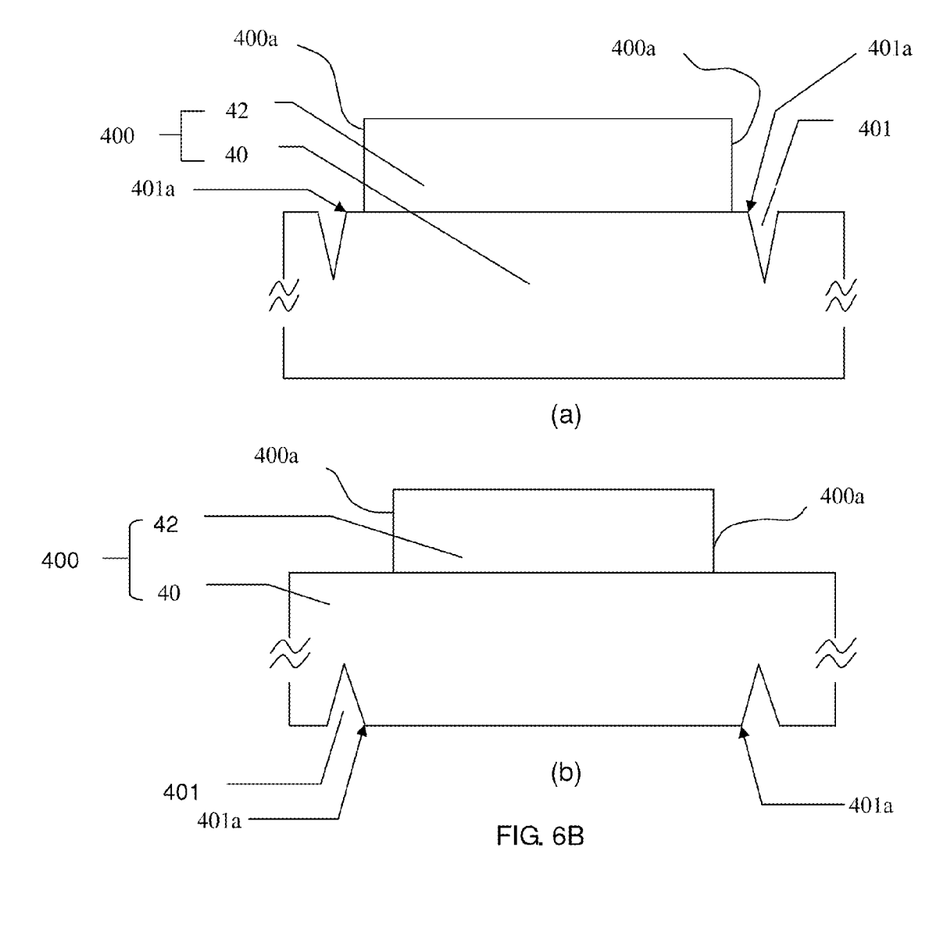

Referring to FIGS. 6A and 6B, cross-sectional views of a light-emitting device in accordance with a third embodiment of the present invention is shown. To avoid the damage to the light-emitting stack caused by the chemical solution, both the process of cutting the substrate to form cutting lines and the afterward process of putting the substrate into a chemical solution to remove the by-product are done before the light-emitting stack is formed. The cutting lines 401 can be formed on the upper surface of the substrate 40 as shown in cross-sectional views (a) of FIGS. 6A and 6B, or can be formed on the lower surface of the substrate 40 as shown in cross-sectional views (b) of FIGS. 6A and 6B. Here, the cross-sectional views (a) of FIGS. 6A and 6B, where the cutting lines 401 are formed on the upper surface of the substrate 40, are taken as an example for following illustration.

The method of manufacturing the light-emitting device comprises cutting the substrate 40 from the upper surface by a laser beam with a wavelength less than 365 nm, and putting the substrate 40 in a chemical solution for a predetermined period of time to remove the by-products resulted from the laser cutting. When the substrate is cut by the laser beam from the upper surface of the substrate 40, cutting lines 401 are formed. By-products 41 comprise a fifth by-product 411 and a sixth by-product 412. The fifth by-product 411 are deposited in the cutting lines 401 and the sixth by-product 412 are deposited around the cutting lines 401 wherein the fifth and the sixth by-products contain the debris of laser ablation from the substrate 40.

The composition of the chemical solution includes $H_3PO_4$ and $H_2SO_4$. The preferred temperature of the chemical solution is higher than the atmospheric temperature. In a preferred embodiment, the temperature of the chemical solution is 175~300° C. In another embodiment, the temperature of the chemical solution is 320° C. The substrate 40 is cleaned in the chemical solution for 10-60 seconds. As illustrated in previous embodiments, a first protective layer can also be deposited on the upper surface of the substrate 40 before the cutting process in order to avoid any damage caused by the chemical solution. Similarly, a second protective layer can be deposited on the lower surface of the substrate 40 in order to avoid any damage caused by the chemical solution. After removing the by-products, the protective layers are removed.

Next, disposing a light-emitting stack 42 over an upper surface of a substrate 40 to form a light-emitting unit 400. Similar to those previously illustrated in FIGS. 5A and 5B, the light-emitting stack 42 may include a first semiconductor layer, a semiconductor light-emitting layer, and a second semiconductor layer. Because the cutting lines 401 comprise a different crystal plane from that of the upper surface of the substrate 40, during epitaxial growth of the light-emitting stack 42, the light-emitting stack 42 material does not grow directly on the cutting lines 401. However, by fine tuning the forming parameters, such as pressure, temperature, and flowing rate of gases to grow the light-emitting stack 42, the materials of the light-emitting stack 42 can still be formed on the cutting lines 401, but as the cutting line 401 comprises multiple crystal planes caused by a laser beam, polycrystalline and/or amorphous materials of the light-emitting stack 42 are formed directly on the cutting lines 401. In contrast, single crystal materials of light-emitting stack 42 are formed on the upper surface of the substrate 40 other than the cutting lines 401. The polycrystalline and/or amorphous materials of the light-emitting stack 42 formed directly on the cutting lines 401 are more fragile than the single crystal materials of the light-emitting stack 42 on other region of the upper surface of the substrate 40. Therefore, it is much easier to break the light-emitting stack 42 along the cutting lines 401 than other region of the substrate 40 when being applied to the same magnitude of force. A subsequent wafer breaking process can be provided to separate the wafer into chips. As a result, the wafer breaking process breaks the fragile materials of the light-emitting stack 42 directly on the cutting lines 401, and the broken materials are removed to leave side walls 400a of light-emitting stack 42 rough. In other words, at least one side wall of one of the chips is rough, and the light extraction efficiency of the light-emitting units 400 is therefore enhanced.

Figure 7:
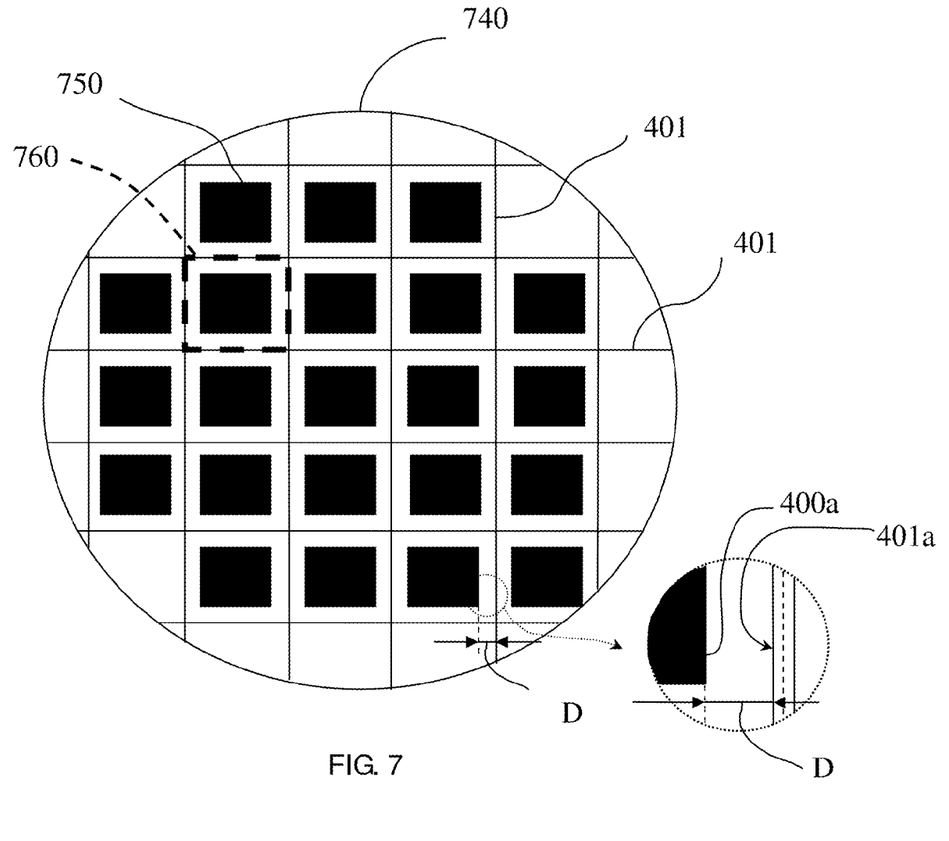
FIG. 7 is a top-view illustrating photoresist and cutting lines in chip defining step in accordance with the one embodiment of the present invention.
Figure 8:
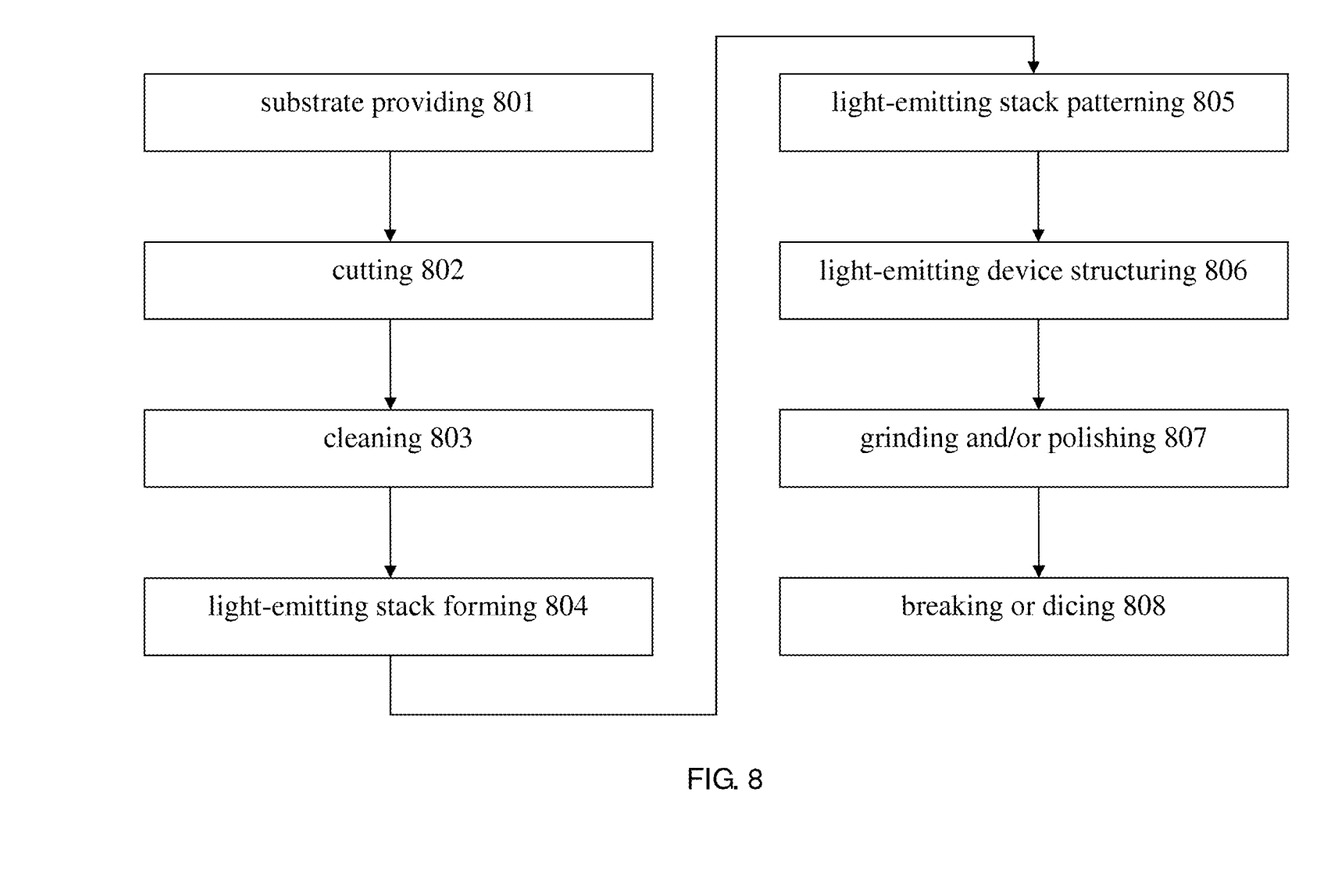
FIG. 8 is a flow chart showing the steps in accordance with the one embodiment of the present invention.

Still another embodiment is illustrated in FIG. 7, and corresponding process is illustrated in FIG. 8. Step 801 is to provide a substrate 40 comprising a wafer with a diameter between 2 inches and 8 inches. Step 802 is to cut the substrate 40 to form cutting lines 401. As illustrated previously, protective layers can also be deposited on one or both surfaces of the substrate 40 before the cutting process in order to avoid any damage caused by the chemical solution in a following cleaning step 803. The cleaning step 803 is mainly to clean the by-products of the cutting step 802 by using the chemical solution as illustrated in previous embodiments. And then step 804 is to form a light-emitting stack 42. The details for these four steps are as the above illustration. For either type illustrated above, i.e., whether the light-emitting stack 42 materials are formed on the cutting lines 401 or not, a lithography and etch process can be used in a light-emitting stack patterning step 805 to pattern the light-emitting stack 42 into a plurality of light-emitting units 400. Each of the light-emitting units 400 substantially corresponds to a chip region 760 previously defined by the cutting lines 401. As illustrated in FIG. 7, a photoresist is used to cover the light-emitting stack 42 to the whole wafer 740, and then the lithography method is used to align and remove part of photoresist that is substantially directly over the cutting lines 401 to leave the remaining photoresist 750 to serve as a mask for a subsequent etch process. And then the etch method such as dry etch, with the remaining photoresist 750 as a mask, is used to remove part of the light-emitting stack 42 that is substantially over the cutting lines 401 to expose the cutting lines 401 and thus pattern the light-emitting stack 42 into a plurality of light-emitting units 400. The remaining photoresist 750 is then removed. The light-emitting unit 400 can be defined, as illustrated in FIG. 7, with a side wall 400a adjacent to but away from the edges 401a of the cutting lines 401 with a distance D, or can be defined with a side wall 400a almost close to the edges 401a of cutting lines 401. That is, the light-emitting stack 42 is patterned into a plurality of light-emitting units 400, and each of the light-emitting units 400 substantially corresponds to the chip region 760. After the light-emitting stack patterning step 805, a light-emitting device structuring step 806 is followed. This is similar to those previously illustrated in FIGS. 5A and 5B, where the semiconductor light-emitting layer and the second semiconductor layer are etched to expose partial of the first semiconductor layer. Following, a first electrode and a second electrode are formed on the first semiconductor layer and the second semiconductor layer respectively.

In one embodiment of the present invention, the method thereof further comprises a wafer grinding and/or polishing step 807. The wafer grinding step is to thin the substrate 40 and the polishing step is to flatten the substrate 40. And the method thereof further comprises a wafer breaking or dicing step 808 along the cutting lines 401 to separate the wafer into chips.

The material of the substrate comprises at least one material selected from the group consisting of sapphire, SiC, GaN, AlN, ZnO, MgO, and any combination thereof. The material of the light-emitting stack comprises at least one material selected from the group consisting of Ga, Al, In, As, P, N, Si, and any combination thereof. The light-emitting stack comprises a first conductive type semiconductor layer, a light-emitting layer, and a second conductive type semiconductor layer. The material of the first conductive type semiconductor layer comprises at least one material selected from the group consisting of AlGaInP, AlInP, GaInP, AlN, GaN, AlGaN, InGaN, and AlInGaN. The material of the light-emitting layer comprises at least one material selected from the group consisting of AlGaInP, AlInP, GaInP, GaN, InGaN, and AlInGaN. The material of the second conductive type semiconductor layer comprises at least one material selected from the group consisting of AlGaInP, AlInP, GaInP, AlN, GaN, AlGaN, InGaN, and AlInGaN. The material of the first protective layer or the second protective layer comprises at least one material selected from the group consisting of gold, platinum, titanium, $Ta_2O_4$, $TiO_2$, $Al_2O_3$, Si, carbon film, $Si_3N_4$, $SiO_2$, epoxy, and photoresist.

In this invention, the light-emitting stack is cutting before the wafer polishing process; it can reduce the breaking rate of the wafer, especially when the thickness of the light-emitting stack is increasing. Besides, by cutting the light-emitting stack before forming the electrodes and dicing process, the light emitting stack is well protected to avoid the chemical solution damaging the semiconductor layer and its electrical property.

It will be apparent; however, that other variations and modifications may be made to the described embodiments, with the attainment of some or all of their advantages. Therefore, it is the object of the appended claims to cover all such variations and modifications that fall within the spirit and scope of the invention.

What is claimed is:

1. A method for manufacturing a light-emitting device comprising the steps of:
    cutting a substrate by a laser beam to form a cavity in the substrate and generate a by-product by the cutting, wherein the by-product comprises a first by-product directly in the cavity and a second by-product on the substrate other than the cavity; and
    removing the by-product by a chemical solution containing an acid under a predetermined cleaning temperature.

2. The method for manufacturing a light-emitting device according to claim 1, further comprising forming a light-emitting stack on the substrate, wherein the step of forming the light-emitting stack comprises:
    forming a first semiconductor layer on the substrate; and
    forming a semiconductor light-emitting layer on the first semiconductor layer; and
    forming a second semiconductor layer on the semiconductor light-emitting layer.

3. The method for manufacturing a light-emitting device according to claim 2, further comprising the steps of:
    removing a portion of the second semiconductor layer and the semiconductor light-emitting layer thereby exposing a portion of the first semiconductor layer; and
    forming a second electrode on the second semiconductor layer and forming a first electrode on the exposed first semiconductor layer.

4. The method for manufacturing a light-emitting device according to claim 2, wherein the step of forming the first semiconductor layer on the substrate is after the step of cutting the substrate by the laser beam.

5. The method for manufacturing a light-emitting device according to claim 1, wherein the cavity comprises a cutting line.

6. The method for manufacturing a light-emitting device according to claim 1, wherein the chemical solution comprises phosphoric acid.

7. The method for manufacturing a light-emitting device according to claim 1, wherein the chemical solution comprises sulfuric acid.

8. The method for manufacturing a light-emitting device according to claim 1, further comprising forming a protective layer on the substrate before the cutting.

9. The method for manufacturing a light-emitting device according to claim 1, wherein the cavity and the light-emitting stack are on opposite sides of the substrate.

10. The method for manufacturing a light-emitting device according to claim 1, wherein the cavity and the light-emitting stack are on the same side of the substrate.

11. The method for manufacturing a light-emitting device according to claim 1, wherein the substrate comprises a material selected from the group consisting of sapphire, SiC, GaN, AlN, ZnO and MgO.

12. The method for manufacturing a light-emitting device according to claim 1, wherein the predetermined cleaning temperature is not lower than 200° C.

13. The method for manufacturing a light-emitting device according to claim 1, wherein the second by-product is capable of being removed at a cleaning temperature unable to remove the first by-product.

14. The method for manufacturing a light-emitting device according to claim 1, wherein the predetermined cleaning temperature is not lower than 250° C.

15. The method for manufacturing a light-emitting device according to claim 1, wherein the cavity comprises a plurality of cutting lines defining a plurality of chip regions.

16. The method for manufacturing a light-emitting device according to claim 1, further comprising a grinding step to thin the substrate.

17. The method for manufacturing a light-emitting device according to claim 1, further comprising a polishing step to flatten the substrate before the cutting.

18. The method for manufacturing a light-emitting device according to claim 3, further comprising a breaking step to separate the substrate with the light-emitting stack into chips.

19. The method for manufacturing a light-emitting device according to claim 18, wherein at least one side wall of one of the chips is rough.

20. The method for manufacturing a light-emitting device according to claim 1, wherein the substrate has a diameter between 2 inches and 8 inches.

* * * * *